United States Patent [19]

Redmayne

[11] Patent Number: 5,650,597
[45] Date of Patent: Jul. 22, 1997

[54] CAPACITIVE TOUCH SENSOR

[75] Inventor: Derek V. Redmayne, Delta, Canada

[73] Assignee: Dynapro Systems, Inc., New Westminster, Canada

[21] Appl. No.: 375,592

[22] Filed: Jan. 20, 1995

[51] Int. Cl.$^6$ .................................. G08C 21/00
[52] U.S. Cl. .......................... 178/19; 345/174; 341/33
[58] Field of Search ........................... 178/18, 19, 20; 345/173, 174; 364/709.1, 709.11; 341/5, 33

[56] References Cited

U.S. PATENT DOCUMENTS

| | | |
|---|---|---|
| 3,482,241 | 12/1969 | Johnson . |
| 4,186,392 | 1/1980 | Holz . |
| 4,233,522 | 11/1980 | Grummer et al. . |
| 4,281,323 | 7/1981 | Burnett et al. . |
| 4,293,734 | 10/1981 | Pepper, Jr. . |
| 4,455,452 | 6/1984 | Schuyler . |
| 4,476,463 | 10/1984 | Ng et al. . |
| 4,550,221 | 10/1985 | Mabusth . |
| 4,707,845 | 11/1987 | Krein et al. . |
| 4,740,781 | 4/1988 | Brown . |
| 4,743,895 | 5/1988 | Alexander . |
| 4,806,709 | 2/1989 | Evans . |
| 4,831,566 | 5/1989 | Mattews et al. ................. 178/20 |
| 4,853,498 | 8/1989 | Meadows et al. . |
| 4,916,699 | 4/1990 | Ohashi . |
| 4,922,061 | 5/1990 | Meadows et al. . |
| 5,041,820 | 8/1991 | Kazama . |
| 5,083,118 | 1/1992 | Kazama . |
| 5,153,572 | 10/1992 | Caldwell et al. . |
| 5,231,381 | 7/1993 | Duwaer . |
| 5,237,879 | 8/1993 | Speeter . |
| 5,270,711 | 12/1993 | Knapp . |
| 5,305,017 | 4/1994 | Gerpheide . |
| 5,418,551 | 5/1995 | Ise ................................. 178/20 |
| 5,488,204 | 1/1996 | Mead et al. ..................... 178/18 |
| 5,491,706 | 2/1996 | Tagawa et al. ................. 178/19 |

*Primary Examiner*—Curtis Kuntz
*Assistant Examiner*—Paul Loomis
*Attorney, Agent, or Firm*—Foley & Lardner

[57] ABSTRACT

The present invention relates to a capacitive touch sensor including a plurality of horizontal sensor bars arranged in a single direction. The touch sensor preferably receives differential sensor signals from the sensor array to reduce proximity effects and noise associated with conventional capacitive touch sensors. The touch sensor also utilizes an isolation circuit or floating interface to reduce the effects of external interference and increase the accuracy of touch sensing and localization. The bars are preferably comprised of indium tin oxide oriented in the machine direction of roll for superior linearity. The touch sensor may be utilized with display screens having thick dielectrics and also eliminates the need for a rear guard layer.

22 Claims, 13 Drawing Sheets

CAPACITIVE TOUCH SENSOR

FIELD OF THE INVENTION

The present invention relates to touch sensitive devices or touch sensors. More particularly, the present invention relates to a capacitive sensor for providing a control signal indicative of where the sensor was touched by a fingertip, utensil, or other body.

BACKGROUND OF THE INVENTION

Capacitive touch sensors generally include a sensor array configured as a matrix of sensor bars arranged in horizontal and vertical directions. Each sensor bar is coupled to a control circuit. The control circuit measures capacitive loading on the array to determine the position or location of the touch on the matrix. The control circuit measures capacitive loading by providing a drive signal to each sensor bar and receiving a sensor signal from each sensor bar. The control circuit analyzes the sensor signals to measure the capacitive loading on the matrix. The measurement of capacitive loading on the horizontal sensor bars allows the capacitive touch sensor to determine the vertical location of the touch, and the measurement of capacitive loading on the vertical sensor bars allows the capacitive touch sensor to determine the horizontal location of the touch.

Sensor arrays including sensor bars disposed in both vertical and horizontal directions have certain drawbacks. For example, a sensor array having a matrix of sensor bars generally requires a large number of layers which are expensive to manufacture. Also, each bar (or set of bars) requires separate sense, drive, and switching circuitry within the control circuit. Further, interleaving sensor bars in two directions (e.g., horizontal and vertical) increases the cost of the sensor array and detrimentally affects the optical performance of the display. Therefore, there is a need for a sensor array having a reduced number of sensor bars which does not utilize an interleaved matrix of sensor bars.

Conventional single sheet capacitive touch sensors are problematic because they are susceptible to body or proximity effects which can significantly decrease the accuracy of the touch localization when used with thick dielectrics. Proximity effects cause the sensor array to be prone to "false" or otherwise inaccurate touch signals or sensor signals. For example, a large conductive body proximate the sensor array may cause the capacitive touch sensor to generate a touch signal (a signal indicating that the array has been touched) when a hand or other object nears the sensor array. The capacitive nature of the large conductive body affects the capacitive loading of the sensor array and may even appear as a touch to the capacitive touch sensor. Large conductive bodies may be hands, forearms, or other objects which can affect the capacitive sensing of the sensor array even though the object is not in contact with (up to several feet away from) the sensor array.

Proximity effects are also associated with a display. A high dielectric constant in the substrate results in capacitive loading from conductive bodies to the rear of the sensor array and also results in proximity effects. Heretofore, capacitive touch sensors have thin dielectrics such as a 0.001 inch or less layer of silicon dioxide. The thin face plate or layer is less affected by the proximity effects. However, thin face plates are prone to scratching and wear.

Conventional capacitive touch sensors are also disadvantageous if they are used with thick dielectrics because they are susceptible to electromagnetic noise from electronic components associated with the display or other devices external the sensor and subject to proximity effects. Capacitive sensors often employ a rear guard layer to prevent electric and magnetic interference generated by the display or other electrical components from affecting the measurement of capacitive loading. The rear guard layer is generally a transparent conductor which is placed on the rear surface of the sensor. Rear guard layers are expensive and often degrade the optical performance of the display, especially the performance of flat screen displays.

Thus, there is a need for a capacitive touch sensor having a sensor array which is easy to manufacture and low cost. Preferably, the sensor array has a reduced number of sensor bars. Also, there is a need for a capacitive touch sensor which does not require a rear guard layer and can be utilized with a screen or window having a thick face layer. Further, there is a need for a capacitive touch sensor which is less susceptible to proximity effects and external electromagnetic noise. Additionally, there is a need for a capacitive sensor topology which is usable with thick dielectrics and which exhibits stability.

SUMMARY OF THE INVENTION

The present invention relates to a capacitive sensor screen for sensing a touch. The touch screen includes a plurality of conducting bars, and a control circuit coupled to the plurality of conducting bars. The plurality of conducting bars are configured in an arrangement wherein each bar is substantially parallel to a first axis and substantially perpendicular to a second axis. The control circuit is coupled to the plurality of conducting bars and provides an excitation signal to the bars. The control circuit receives a capacitive sense signal from the conductive bars and provides a control signal indicative of the position of the touch on the arrangement. The control signal indicates the position along the first axis and the position along the second axis.

The present invention also relates to a method of locating the position of a touch on a touch sensor including an array of bars disposed in parallel to a first axis and a control circuit. The control circuit provides excitation signals to a first side of the array, receives sense signals at a second side of the array, provides excitation signals to the second side of the array, and receives sense signals at the first side of the array. The method includes the steps of:

determining a closest bar of the array of bars and response to the sense signals, the closest bar being a bar nearest the touch; determining a first position of the touch along a second axis perpendicular to the first axis by determining a bar location of the closest bar in the array of bars; and determining a second position of the touch along the first axis by analyzing at least one of the said sense signals received on the first side of the array and at least one of the sense signals received on the second side of the array.

The present invention also relates to an improved capacitive touch screen for use with the display which provides images on its face. The touch screen is situated proximate the face of the display and includes a control circuit for generating a position signal indicative of the vertical and horizontal location of a touch. The improvement is a capacitive sensor array consisting of bars extending only in a horizontal direction.

The present invention further relates to a touch sensor having a sensor array. The touch sensor includes a power supply, an excitation driver for providing an excitation signal, a control circuit, and a floating interface circuit. The excitation driver and control circuit are coupled to the power supply. The floating interface circuit is coupled to the power supply, the sensor array, the excitation driver and the control circuit. The floating interface circuit receives a power signal referenced to the excitation signal. The excitation driver provides the excitation signal to the sensor array through the floating interface and the control circuit receives a sense signal from the sensor array through the floating interface circuit.

The present invention even further relates to an improved capacitive touch sensor system including a capacitive sensor array and a control circuit. The control circuit provides an excitation signal and receives a differential signal. The control circuit generates a control signal indicative of a position of a touch in response to the differential signal. The improvement includes an interface circuit referenced to the excitation signal. The interface circuit is coupled between the control circuit and the capacitive sensor array. The control circuit is referenced to ground.

In one aspect of the present invention, the capacitive touch screen may sense a touch through an isolated signal plane which is driven by the excitation waveform. The isolated signal plane is a floating interface which can include a preamplifier, electrostatic discharge (ESD) protection, and signal processing circuits. The use of a floating isolation circuit reduces the effects of external interference, thereby increasing the accuracy of touch sensing and localization.

In another aspect of the present invention, the sensor array associated with the capacitive touch screen includes an array of bars extending in a single direction. The bars are preferably comprised of indium tin oxide (ITO) oriented in the machine direction of roll coated ITO for superior linearity.

In yet another aspect of the present invention, the capacitive touch screen utilizes differential sensing signals to detect low level signals. The use of differential signals reduces the proximity effects and thereby allows the use of laminated screens or screens having thick dielectrics. Differential signals also eliminate the need for a rear guard layer in some instances.

In still another aspect of the present invention, a control circuit associated with a touch screen having horizontal bars may interpolate between sensing bars to determine a more accurate vertical position. The control circuit also senses the horizontal position by driving excitation signals on one side of the array and receiving sensor signals from the other side of the array. The sensor signals are advantageously developed across the elements in order to determine vertical and horizontal coordinates.

BRIEF DESCRIPTION OF THE DRAWINGS

The invention will hereafter be described with reference to the accompanied drawings, wherein like numerals denote like elements, and.

DETAILED DESCRIPTION OF THE PREFERRED EXEMPLARY EMBODIMENT

Figure 1:
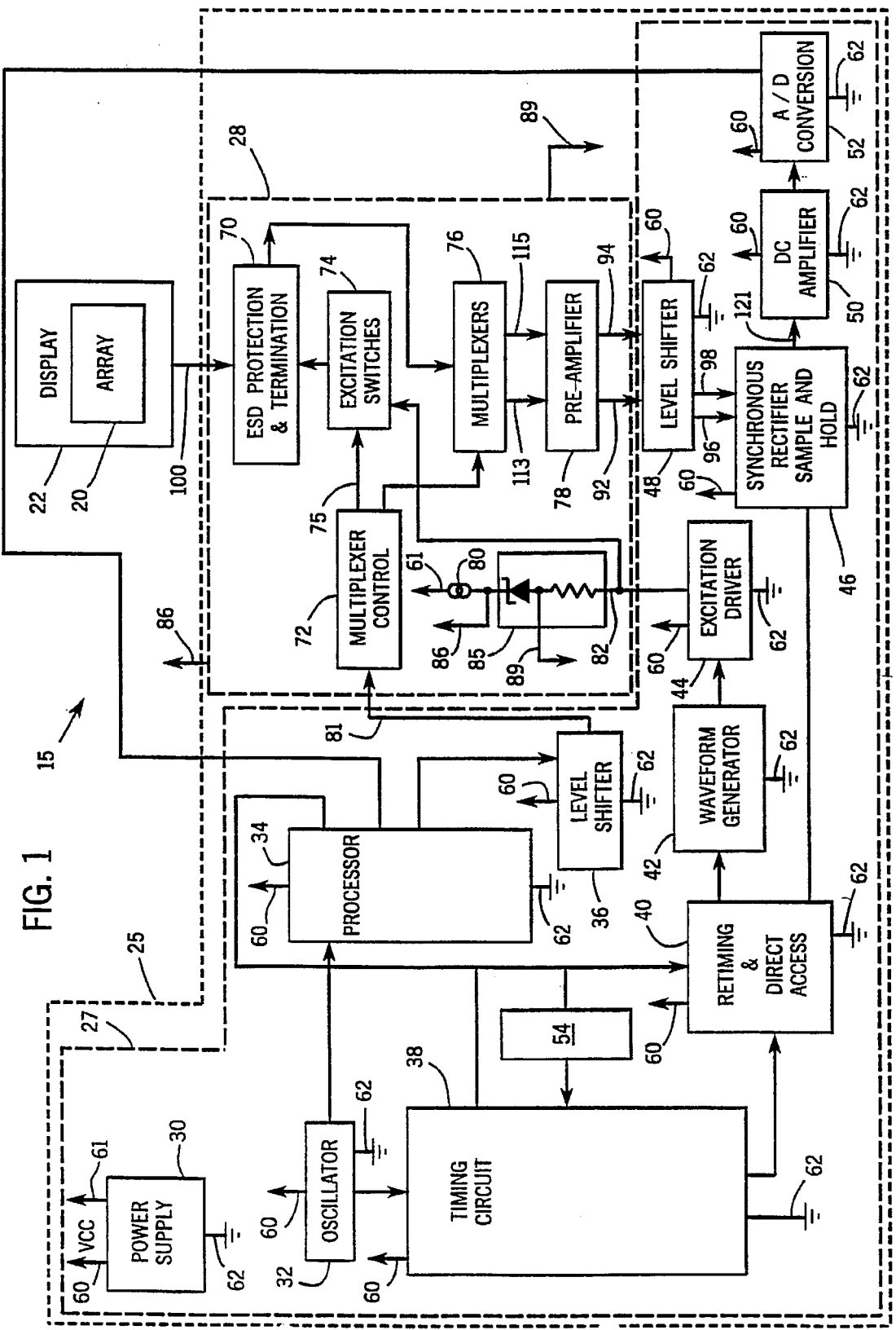
FIG. 1 schematically illustrates a capacitive touch sensor in block diagram form in accordance with an exemplary embodiment of the present invention.

FIG. 1 is a schematic block diagram of a touch screen or capacitive touch sensor 15 including a capacitive sensor array 20 which is operatively associated with a display 22. (Display 22 is shown physically associated with array 20, but is not a part of sensor 15.) Capacitive touch sensor 15 may be used with a variety of display devices, such as a CRT, LCD, projector, printed overlay, printed underlay or other arrangement which provides display information from which a user makes a selection. Alternatively, capacitive touch sensor 15 may be a hand held tablet or other device located proximate a display, such as a billboard, sign, or menu. The user may touch sensor 15 to select data or otherwise provide information.

Array 20 is preferably mounted within a sandwich of dielectric layers (e.g., approximately 0.040 inches under a front surface) or on a rear surface of a window (not shown) which is located in front of display 22. The window is typically held by a grounded metal bezel surrounding the periphery of the window. A guard layer (not shown) can be applied to the rear surface of the window over array 20 to shield array 20 from electromagnetic interference.

Capacitive touch sensor 15 includes a control circuit 25 coupled to sensor array 20 via an electromagnetic link 100. Control circuit 25 includes a pre-amp or isolation interface 28 and a fixed circuit 27. Fixed circuit 27 includes a power supply 30, an oscillator 32, a processor 34, a level shifting circuit 36, a timing circuit 38, a re-timing and direct access circuit 40, a waveform generator 42, an excitation driver 44, a synchronous rectifier 46, a level shifting circuit 48, a direct current (DC) amplifier 50, an analog-to-digital (A/D) converter 52, and a register 54. Fixed circuit 27 is coupled to interface 28 via a conductor 82, a conductor 81, a conductor 61, a conductor 92 and a conductor 94.

Fixed circuit 27 is powered by power supply 30 which provides a VCC voltage level at a conductor 60 and a ground voltage level at a conductor 62. Power supply 30 preferably provides the VCC voltage level at +5 V for fixed circuit 27. Power supply 30 provides a +12 V signal at a conductor 61 for interface 28. Also, power supply 30 provides a +5 V analog power signal, an analog ground power signal, and other power signals for capacitive touch sensor 15. Power supply 30 may be configured to provide a variety of voltage levels such as +5 V, +12 V, −12 V, ground, or other necessary voltage levels.

Isolation interface 28 includes an electrostatic discharge (ESD) protection circuit 70, a multiplexer control circuit 72, an analog switch circuit 74, a multiplexer circuit 76, a shunt regulator 85, and a preamplifier 78. Interface 28 is preferably a floating circuit and is powered through a +12 V signal provided by conductor 61 from supply 30 through a current source 80. Capacitive touch sensor 15 may be configured for use with a variety of voltage levels such as −12 V or +24 V in accordance with design criteria for sensor 15. Interface 28 may utilize transformers, converters, or other devices for isolating array 20 from fixed circuit 27. Circuits within interface 28 are preferably powered between a positive power conductor 86 and a negative power conductor 89.

Current source 80 provides power to shunt regulator 85 which is referenced to an excitation signal (drive signal) from excitation driver 44 on a conductor 82. Therefore, the power signal between conductors 86 and 89 for interface 28 is referenced to the excitation signal. The power rides on the excitation signal provided to interface 28 (e.g., the power between conductors 86 and 89 is referenced to the excitation signal), thereby isolating electromagnetic interference and allowing the excitation signals and sensor signals to be provided without ground interference from fixed circuit 27. Further, referencing isolation interface 28 to the excitation signal prevents small amounts of parasitic capacitance in multiplexer circuit 76 and ESD protection circuit 70 from affecting the integrity of the sensor signals and provides a high common mode rejection ratio.

Sensor array 20 is coupled to control circuit 25 through isolation interface 28. Hence, array 20 is effectively floating or isolated (e.g., array 20 is referenced to the excitation signal). Interface 28 is coupled to level shifting circuit 48 via conductors 92 and 94, multiplexer control circuit 72 via conductor 81, and excitation driver 44 via conductor 82. Powering sensor array 20 and interface 28 with a power signal upon which the excitation signal rides advantageously increases the accuracy of the touch localization by reducing common mode components on the sensor signals from preamplifier 78. Alternatively, isolation interface 28 may be powered by a DC to DC converter having outputs riding on the excitation signal.

The operation of sensor 15 is discussed generally below with reference to FIG. 1. Processor 34, operating resident software, provides encoded bits or digital excitation control signals to register 54 so that control circuit 25 produces an excitation signal or waveform for eventual reception by sensor array 20. After the excitation signal is provided to array 20, processor 34 receives a digital representation of sensor signals via A/D converter 52. The sensor signals are indicative of the capacitive loading on array 20. Processor 34 determines the location of the touch by analyzing the sensor signals.

Timing circuit 38, re-timing circuit 40, waveform generator 42, and excitation driver 44 cooperate to produce the excitation signal in response to excitation control signals provided by register 54. The excitation control signals program the duty cycle and frequency of the excitation signal and coordinate the reception of the sensor signals by multiplexer circuit 76. The excitation signal is preferably an analog pulsing signal; an exemplary excitation signal is described in more detail with reference to FIG. 5 below. Alternatively, processor 34 directly produces the excitation signal through a digital-to-analog (D/A) converter, current mirrors, or other analog circuits and provides the excitation signal to driver 44. In this embodiment, processor 34 may be a microcomputer such as an 80C52, a digital signal processor, a general purpose microprocessor, or other similar digital processor.

Timing circuit 38 generates the digital representation of the excitation signal utilizing counters such as a Johnson decade counter and other logic circuitry (not shown). The digital representation is created from a pulse signal generated from a 16 MHz signal provided by oscillator 32. The pulse signal is provided to re-timing circuit 40. Re-timing circuit 40 re-synchronizes the digital representation to eliminate propagation delays associated with register 54 and timing circuit 38 and reduces "jitter" and other noise associated with the pulse signal. The digital representation is provided to waveform generator 42. Alternatively, circuits 38 and 40 may be eliminated and processor 34 may be configured to internally generate the digital representation of the excitation signal.

Waveform generator 42 provides the excitation signal to excitation driver 44 in response to the digital representation. Waveform generator 42 is preferably an operational amplifier (not shown in FIG. 1) configured as an integrator with analog switches which appropriately inject positive and negative current to the inputs of the amplifier so that the amplifier generates the excitation signal. In this preferred embodiment, the excitation signal is a burst of 16 trapezoidal waveforms. Each burst lasts 500 milliseconds; each waveform is comprised of two complimentary ramps with a dwell period between the ramps. In this embodiment, the excitation signal has a 3 V peak-to-peak amplitude. For thicker dielectrics, substantially higher excitation voltage levels up to approximately 20 V peak-to-peak may be required.

Excitation driver 44 provides the excitation signal at conductor 82 for reception by analog switch circuit 74. Excitation driver 44 is preferably an operational amplifier configured to have a gain of 28. Analog switch circuit 74 is controlled by switch control signals on conductor 75 provided by multiplexer control circuit 72. The switch control signals open and close switches such as 4066 analog devices (not shown) in circuit 74 so that the excitation signal is appropriately provided to ESD protection circuit 70 and across link 100 to sensor array 20. Processor 34 generates the switch control signals in response to the resident software and provides the signals through level shifting circuit 36 via conductor 86 to multiplexer control circuit 72 so that the switches in analog switch circuit 74 are closed when the excitation signal is provided on conductor 82.

The excitation signals are provided through ESD protection circuit 70 to sensor array 20. Circuit 70 prevents large voltages and currents from passing between sensor array 20 and interface 28 by clamping the signals on link 100. Also, circuit 70 provides proper biasing to array 20.

When sensor array 20 is driven with the excitation signal, sensor array 20 provides sensor signals through link 100 and ESD protection circuit 70 to multiplexer circuit 76 for eventual analysis by processor 34. The sensor signals are indicative of the capacitive loading on array 20 and are generally 2–20 mV waveforms (depending upon the thickness of the dielectric) riding on the 3 V peak-to-peak excitation signal. Processor 34 controls multiplexer circuit 76 by providing multiplexer control signals through level shifting circuit 36 to multiplex control circuit 72. The multiplexer control signals cause multiplexer circuit 76 to select or sample particular sensor signals from array 20. Preferably, multiplexer circuit 76 selects two sensor signals from array 20 and provides the sensor signals on conductors 113 and 115.

Processor 34 provides the multiplexer control signals to multiplexer control circuit 72 in response to the resident software. Multiplexer circuit 76 is synchronized with the excitation signal so that signals resulting from bursts of 16 trapezoidal waveforms of the excitation signal can be sensed on array 20. Multiplexer circuit 76 advantageously reduces the circuitry required to analyze the sensor signals by allowing processor 34 to choose particular or selected sensor signals. Alternatively, preamplifier 78 could be configured to receive a larger number of sensor signals which could be transmitted to processor 34 for analysis.

Preamplifier 78 amplifies the sensor signals and provides the amplified sensor signals on conductors 92 and 94 to level shifting circuit 48. Level shifting circuits 36 and 48 translate the voltage levels between fixed circuit 27 and interface 28. Level shifting circuit 36 adjusts the voltage level of switch and multiplexer control signals provided by processor 34 to interface 28. Similarly, level shifting circuit 48 adjusts the sensor signals provided by preamplifier 78 on conductors 92 and 94 from the voltage level of interface 28 to the voltage level associated with fixed circuit 27.

Level shifting circuit 48 provides the sensor signals to synchronous rectifier 46 via conductors 96 and 98. Synchronous rectifier 46 provides band pass filtering, rectifies the sensor signals, and stores the difference between the sensor signals as a sample signal. Synchronous rectifier 46 is controlled by re-timing circuit 40 so that the sensor signals are rectified in accordance with the state of the excitation signal so that the AC sensor signals are appropriately stored as a dc sample signal. More particularly, synchronous rectifier 46 appropriately gates the negative and positive cycles of the excitation signal such that they both contribute to sample accumulation. Synchronous rectifier 46 provides band pass filtering centered on the frequency of the excitation signal (e.g., 30 KHz).

The sample signal is a charge accumulation associated with the difference between sensor signals on conductors 96 and 98; the car the charge, the larger the capacitive loading associated with sensor array 20. The sample signal is provided on a conductor 121 and is representative of the difference between the sensor signal on conductor 96 and the sensor signal on conductor 98. The use of a difference signal advantageously reduces parasitic capacitance effects and proximity effects associated with the bezel (not shown) or other external devices and rejects noise associated with sensor 15 and display 22.

DC amplifier 50 amplifies the sample signal on conductor 121. DC amplifier 56 provides the amplified signal to A/D converter 52. A/D converter 52 is preferably a serial A/D converter which provides a serial digital word to processor 34 indicative of the difference between the sensor signals on conductors 96 and 98 (e.g., the sample signal). Processor 34 preferably analyzes the sample signal and determines whether a touch occurred and the localization of that touch on array 20.

Figure 2:
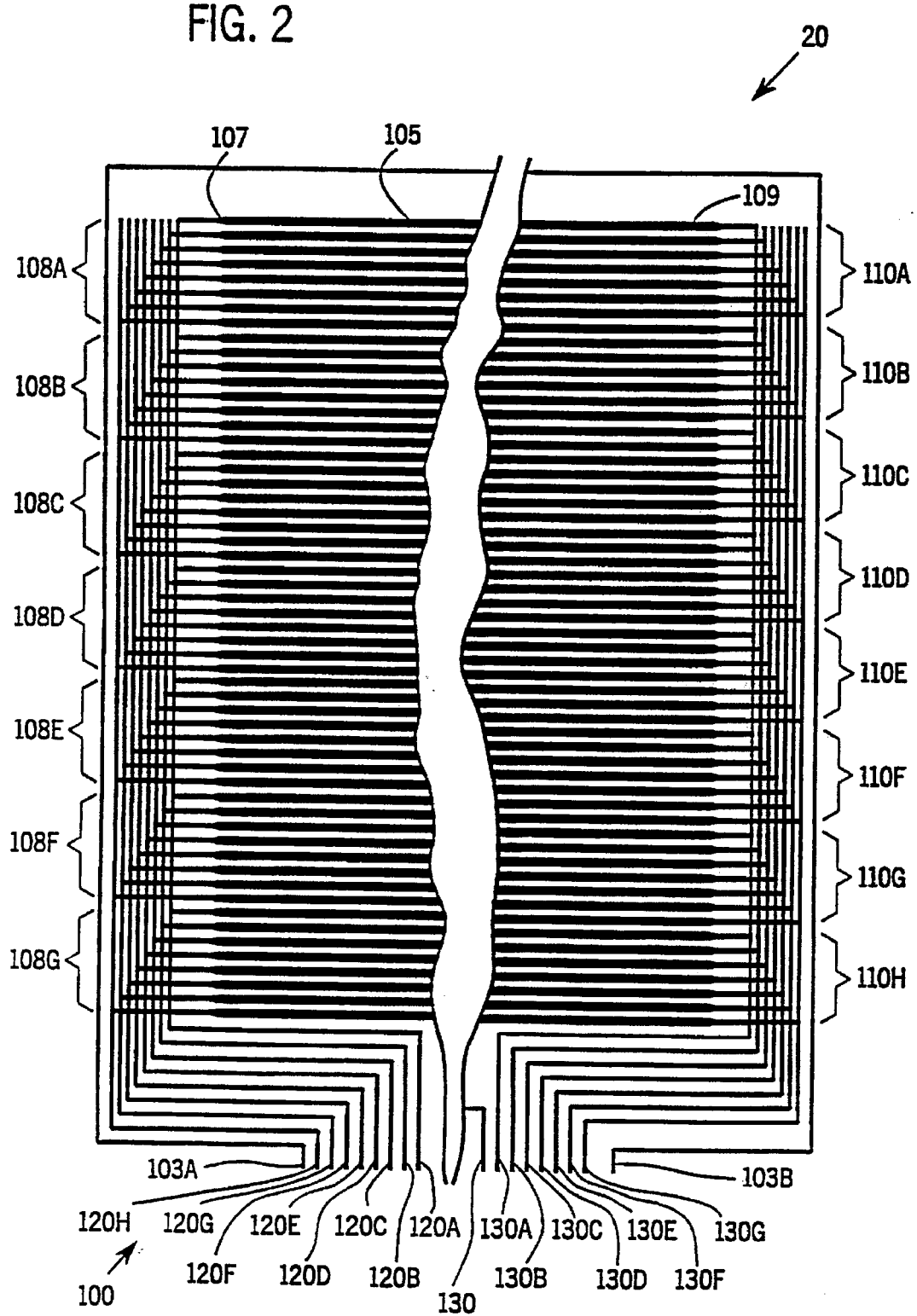
FIG. 2 schematically illustrates a sensor array for the capacitive touch screen illustrated in FIG. 1.

With reference to FIG. 2, sensor array 20 includes 56 horizontal sensor bars 105. A left side 107 of horizontal bars 105 are grouped into seven sets 108A–G of eight bars 105. A right side 109 of horizontal bars 105 are grouped into eight sets 110A–H of seven horizontal bars 105.

Link 100 includes left conducting lines 120A–H and right conducting lines 130A–G. A first left conducting line 120A is coupled to a first bar of bars 105 in each of sets 108A–G. An eighth conducting line 120H is coupled to an eighth bar of bars 105 in each of sets 108A–G. Conducting lines 120B–G are coupled to the second through seventh bars of each of sets 108A–G, respectively. Similarly, a first right conducting line 130A is coupled to a first bar of bars 105 in each of sets 110A–H. A seventh conducting line 130G is coupled to a seventh conducting bar in each of sets 110A–H. Conducting lines 130B–130G are coupled to the second through sixth sensor bars of sets 110B–G, respectively. Link 100 further includes guard conductors 103A and B surrounding the periphery of array 20. Guard conductors 103A–B eliminate parasitic loads associated with the bezel and other components. Guard conductors 103A–B are driven with the excitation signal. Conducting lines 120A–H and 130A–G coupled to ESD protection circuit 70.

Sensor bars 105 are preferably made of indium tin oxide (ITO). In one embodiment, bars 105 may cover the entire area or beyond the periphery of display 22. Each bar 105 is 0.149 inches by 11.25 inches and has a conductivity of 300 ohm per square ITO. Each bar has an impedance of approximately 22K ohm from left side 107 to right side 109. Preferably, bars 105 are oriented in the machine direction of roll coated polyester, thereby advantageously exhibiting good linearity with respect to resistance. Bars 105 are preferably formed in a printing process, photo-lithographic technique, or scored with a laser. Bars 105 may also be comprised of tin oxide, indium antimony tin oxide, or other transparent conductors.

Sensor bars 105 are spaced 0.015 inches apart from each other. Therefore, the top of a first conducting bar 105 is 0.164 inches from a top of a second conducting bar 105. The width of each bar is preferably less than a typical contact area caused by touching sensor array 20 with a finger (less than 0.25 inches). Sensor array 20 is 9.2 inches by 11.5 inches. Lines 120A–H and 130A–G are silver ink conductors. The above dimensions, characteristics and materials are given as an exemplary embodiment only, and do not limit the scope of the invention as recited in the claims. A sensor array 20 may be designed with various numbers of sensor bars of various sizes without departing from the spirit of the invention.

Figure 3:
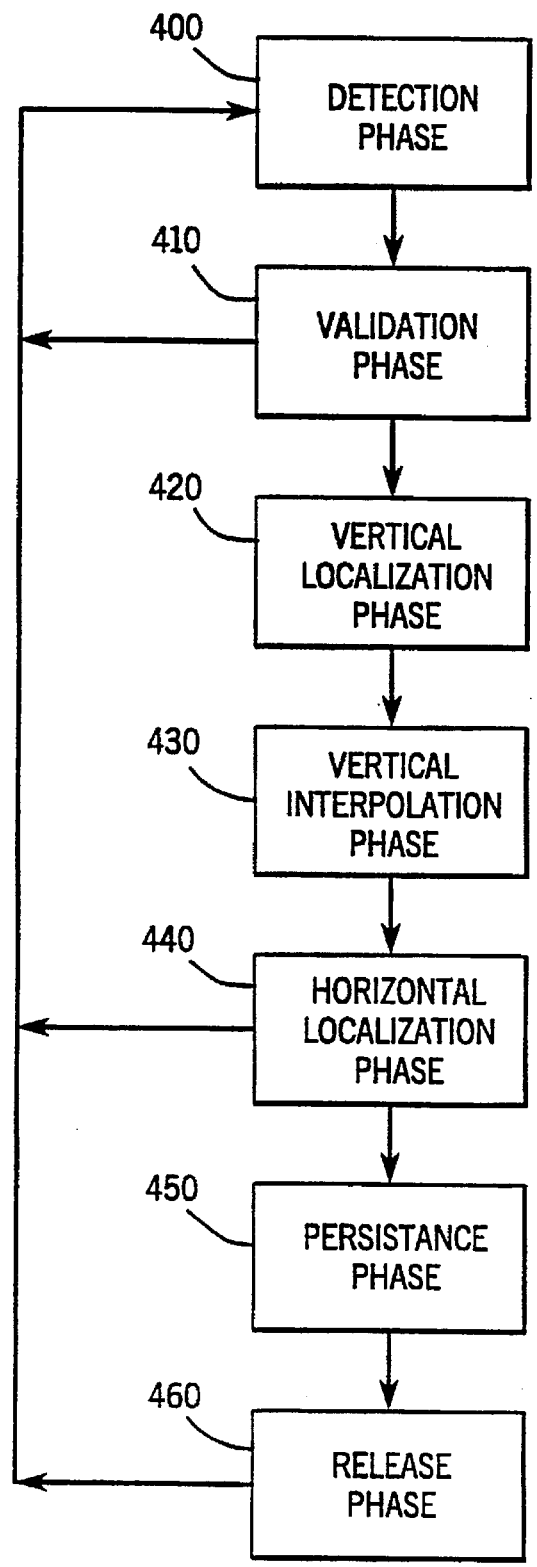
FIG. 3 is a flow chart showing the operation of the capacitive touch sensor illustrated in FIG. 1.

The operation of sensor 15 is discussed below with reference to FIGS. 1–3. Generally, processor 34 is programmed to localize a touch with a high degree of accuracy by performing five phases of operation to detect and localize a touch (FIG. 3). Control circuit 25 performs a detection phase 400 which scans array 20 to determine if a contact has occurred; a validation phase 410 to determine if the contact is a "single", "bonafide" touch of array 20; a vertical localization phase 420 to determine about which bar 105 the touch is centered; a vertical interpolation phase 430 to determine the vertical position of the touch to a high degree of accuracy; a horizontal localization phase 440 to determine the horizontal position to a high degree of accuracy; persistence phase 450 to determine if the touch has moved; and a release phase 460 to determine if the touch has ceased. The persistence phase 450 and release phase 460 are optional and are not necessary for touch localization.

In operation, processor 34, configured according to resident software, provides control signals to register 54 so that the excitation signal is provided on conducting lines 120A–H and 130A–G in detection phase 400. More particularly, driver 44 provides the excitation signal at conductor 82 to analog switch circuit 74. Analog switch circuit 74 includes analog switches (not shown) coupled in series with circuit 70. When the analog switches are closed, the excitation signal (e.g., eight trapezoidal waveforms to side 107 and eight trapezoidal waveforms to side 109) is provided to lines 120A–H and 130A–G. When the excitation signal is provided to one side of bars 105 (e.g., side 107 of bars 105), the other side of bars 105 (e.g., side 109) is simultaneously grounded. The analog switches are controlled by the switch control signals provided to multiplexer control circuit 72 through shift circuit 36 by processor 34.

In detection phase 400, control circuit 25 is determining as rapidly as possible if sensor array 20 has been touched. Control circuit 25 samples every adjacent pair of lines 120A–H and 130A–G. Alternatively, control circuit 25 can rapidly sample every other pair of lines 120A–H and 130A–G on only one side of array 20, thereby reducing the amount of time required to sense a touch. Control circuit 25 samples the lines 120A–H and 130A–G by providing the excitation signal to one side of array 20 (e.g., to lines 120A–H) and receiving sensor signals from the other side of array 20 (e.g., from lines 130A–G). The sampling rate is approximately 4 KHz.

The sensor signals on the pairs of lines 120A–H and 130A–G are received through circuit 70 by multiplexer circuit 76. Multiplexer circuit 76 selects sensor signals on particular lines 120A–H and 130A–G in response to the multiplexer control signals received by multiplexer control circuit 72. Multiplexer control circuit 72 and processor 34 cooperate to ensure that lines 120A–H and 130A–G are appropriately selected and provided in correct synchronization with the excitation signal. The selected sensor signals are provided on conductors 113 and 115 to preamplifier 78. Preamplifier 78 preferably has a gain of 6 and provides the sensor signals on conductors 113 and 115 to conductors 92 and 94, respectively.

Synchronous rectifier 46 provides a differential (sample) signal on conductor 121 representative of the difference between the sensor signals on conductors 113 and 115. The difference signal is amplified by amplifier 50 and provided as serial data to processor 34 by converter 52. In one cycle of the sampling, processor 34 provides the excitation signal and receives sensor signals for eight pairs of lines 120A–H and seven pairs of lines 130A–G.

As processor 34 receives the data for each sampled pair of conducting lines 120A–H and 130A–G, processor 34 compares the data for each pair to the running average sample signal for that pair. If the data is an incremental change from the running average (e.g., over 2–5% of full scale), the pair at conducting lines 120A–H and 130A–G is flagged as a potential touch. (The running average is continuously updated as sensor signals are received; however, a flagged sample pair is not used to adjust the running average).

If the same pair is flagged in two successive cycles of samples, processor 34 concludes that a touch has been sensed. Thus, initial detection of a touch generally takes at least two passes of the excitation signal at a rate of 4 KHz. Therefore, processor 34 receives 16 samples of pairs of sensor signals in 8 milliseconds to determine if a touch has occurred. Two passes of the excitation signal include 32 trapezoidal waveforms. Preferably, the above-mentioned procedure of providing the excitation signal and receiving the sensor signals is repeated in detection phase 400 until a touch is sensed.

When a touch is sensed, processor 34 advances to validation phase 410 and determines whether the flagged pairs are legitimate or valid touches. To determine whether a touch is valid, processor 34 samples array 20 to collect stable data. Preferably, the periods for sampling stable data exist in multiples of 16.666 milliseconds so that each sample is 8.33 milliseconds apart, thereby providing notch filtering operations at 60 Hz. In validation phase 410, processor 34 preferably takes samples of stable data by receiving sensor signals from each pair of lines 120A–H and each pair of lines 130A–G. Thus, processor 34 sequentially measures or samples the sensor signals between all lines 120 A–H and 130 A–G (e.g., lines 130A and B, 130A and C, 130A and D, etc.)

In validation phase 410, processor 34 matches profiles of the sensor signals received from side 107 and side 109. Preferably, processor 34 determines the peak value of the data obtained from lines 120A–H (side 107 of bars 105) and the peak value of the data from lines 130A–G (side 109 of bars 105). Next, processor 34 determines the values of the side lobes associated with the peak values for each of sides 107 and 109. The side lobes are the next highest data or values from lines 120A–H and 130A–G. If the side lobes from each of side 107 and 109 are within 5% after normalization with their respective peak, processor 34 considers the touch to be valid. If processor 34 does not identify side lobes of appropriate amplitudes, processor 34 does not consider the touch to be valid and returns to phase 400.

After processor 34 has determined that a valid touch has occurred, processor 34 advances to the vertical localization stage 430 and determines general vertical localization of the touch by determining the closest sensor bar 105 to the touch or the peak bar. A bar 105 having the peak value is referred to as the peak bar. The closest sensor bar 105 is determined by comparing the peak data from conducting lines 120A–H and the peak data from conducting lines 130A–G. For example, if the peak data for side 107 occurs on conducting line 120A and the peak data for side 109 occurs on conducting line 130A, the first sensor bar of bars 105 is closest to the touch. If the peak data is received from conducting line 120A and conducting line 130C, the seventeenth conducting bar of bars 105 is nearest the touch. The configuration of array 20 advantageously allows sensor bar 105 nearest the touch (e.g., the peak bar) to be determined and yet utilize a minimum number of conducting lines 120A–H and 130A–G.

The general vertical location is calculated according to Equation 1 as follows:

$$\text{Bar number} = \text{modula } 8\ (R-L) \times 7 + R \tag{1}$$

where:

Bar number=the number of the peak bar;

R=the number of the line 130A–G (1 through 8) which corresponds to the peak data; and L=the number of the line 120A–H (1 through 7) which corresponds to the peak data.

After the gross vertical location is determined (the position of bar 105 closest the touch), processor 34 performs vertical interpolation at vertical interpolation stage 430 to determine a more precise location of the touch.

The sensor values for the peak bar and bar immediately above the peak bar and bar immediately below the peak bar may be utilized to interpolate a position between bars 105 at stage 430. For example, the vertical coordinate may be calculated according to Equation 2 as follows:

$$V = N - (n-1/n) + (n+1)/n \tag{2}$$

where:

V=the vertical position of the touch;

N=the peak bar number;

n=the sensor value for the peak bar;

n−1=the sensor value for the bar above the peak; and n+1=the peak value for the bar below the peak.

Alternatively, the vertical coordinate can be calculated according to Equation 3 as follows:

$$V = (N-(n-1/n) + (n+1/n) + (N-1) - (n-2/n-1) + (n/n-1) + (N+1) - (n/n+1) + (n+2/n+1))/3 \tag{3}$$

where:

n−2 is the sensor signal value for bars two above the peak bar; and n+2 is the sensor signal value for two bars below the peak bar.

Equation 3 provides better interpolation and reduces non-linearities associated with the circular contact region of a compressed finger.

After vertical interpolation phase 430, processor 34 advances to horizontal location phase 440 and analyzes the data to determine the horizontal location of the touch. Processor 34 determines the horizontal location of the touch by analyzing the data from lines 120A–H and 130A–G. The data for the peak bar from side 107 (conducting lines 120A–H) is multiplied by 8/7 or 1.1428 to compensate for the difference the number of conducting lines 120 A–H and 130

A–G. The horizontal position is determined according to the Equation 4 as follows:

$$H = R/(L+R) \quad (4)$$

where:
   H=the horizontal position of the touch;
   R=the sensor signal for the peak bar received on conducting lines 130A–G; and
   L=the sensor signal value for the peak bar (adjusted) on conducting lines 120A–H.

After the vertical and horizontal coordinates for the touch are found, processor 34 may be configured to store the coordinates or communicate the coordinates to other components associated with sensor 15. After the touch has been localized, processor 34 returns to detection phase 400 or advances to persistence phase 450.

Persistence phase 450 encompasses two modes of operation, a dwell mode and a drag mode. In the dwell mode, if the touch is left at one point for an extended period of time, processor 34 may repeat sensing functions to further evaluate the location of the touch. Alternatively, in the dwell mode, processor 34 may provide signals to array 20 to determine confidence levels for the coordinates. In yet another alternative, processor 34 may repeat sensing operation as the touch is released. Sensor signals are generally more accurate as the touch is released from display 22.

In the drag mode, processor 34 determines if the location of the touch is moving. For example, processor 34 may sample entire array 20, scan a side 107 or simply bars 105 above and below the peak bar to determine if the location of the touch is moving. By sampling less than entire array 20, sensor 15 is able to accurately track quickly moving touches. After persistence phase 450, processor 34 enters the release phase 460 and re-enters detection phase 400.

Figure 4A:
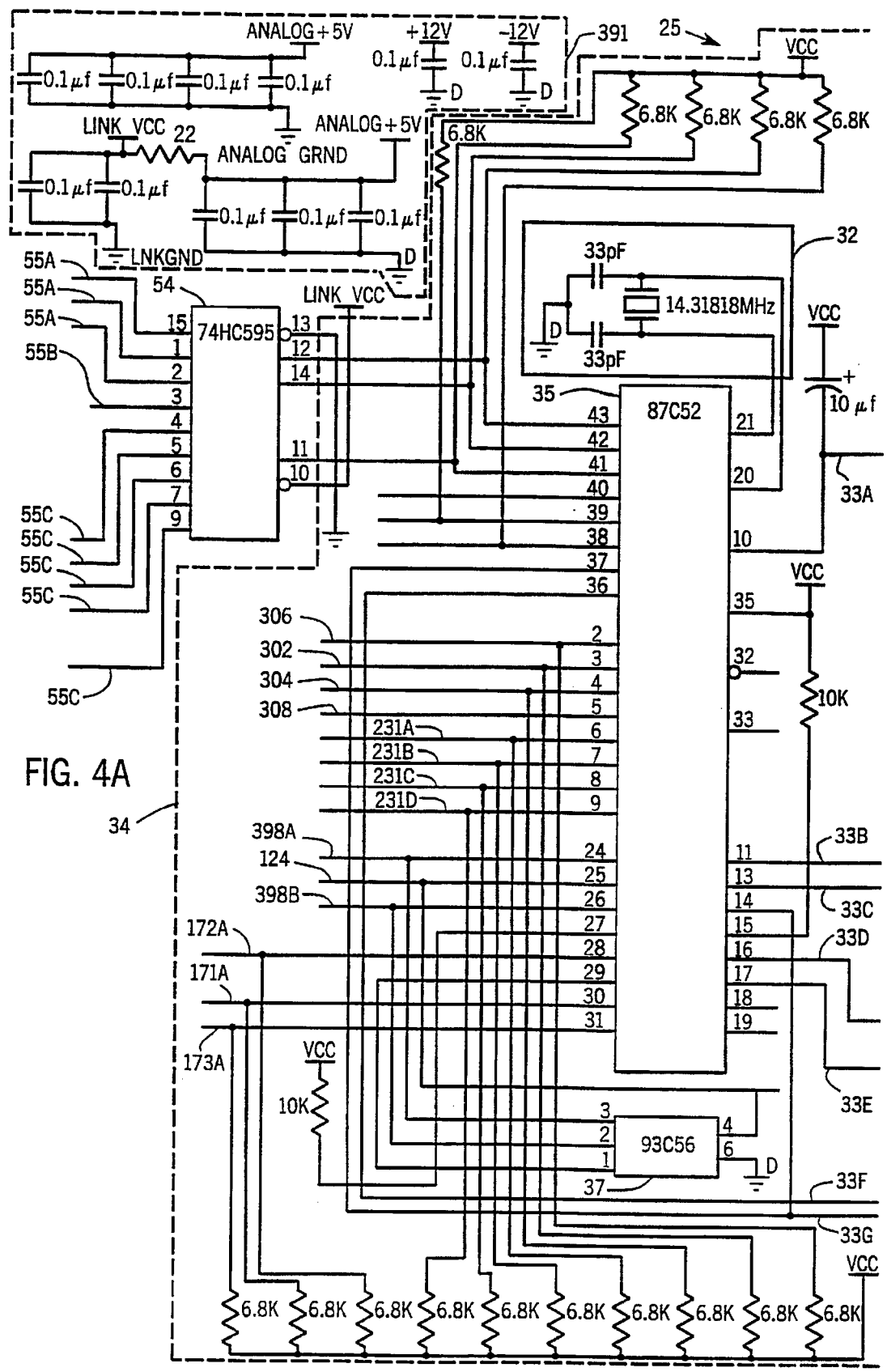
FIGS. 4A–I are detailed electrical schematics of a control circuit for a sensor similar to the capacitive touch sensor illustrated in FIG. 1 in accordance with another exemplary embodiment of the present invention.
Figure 4B:
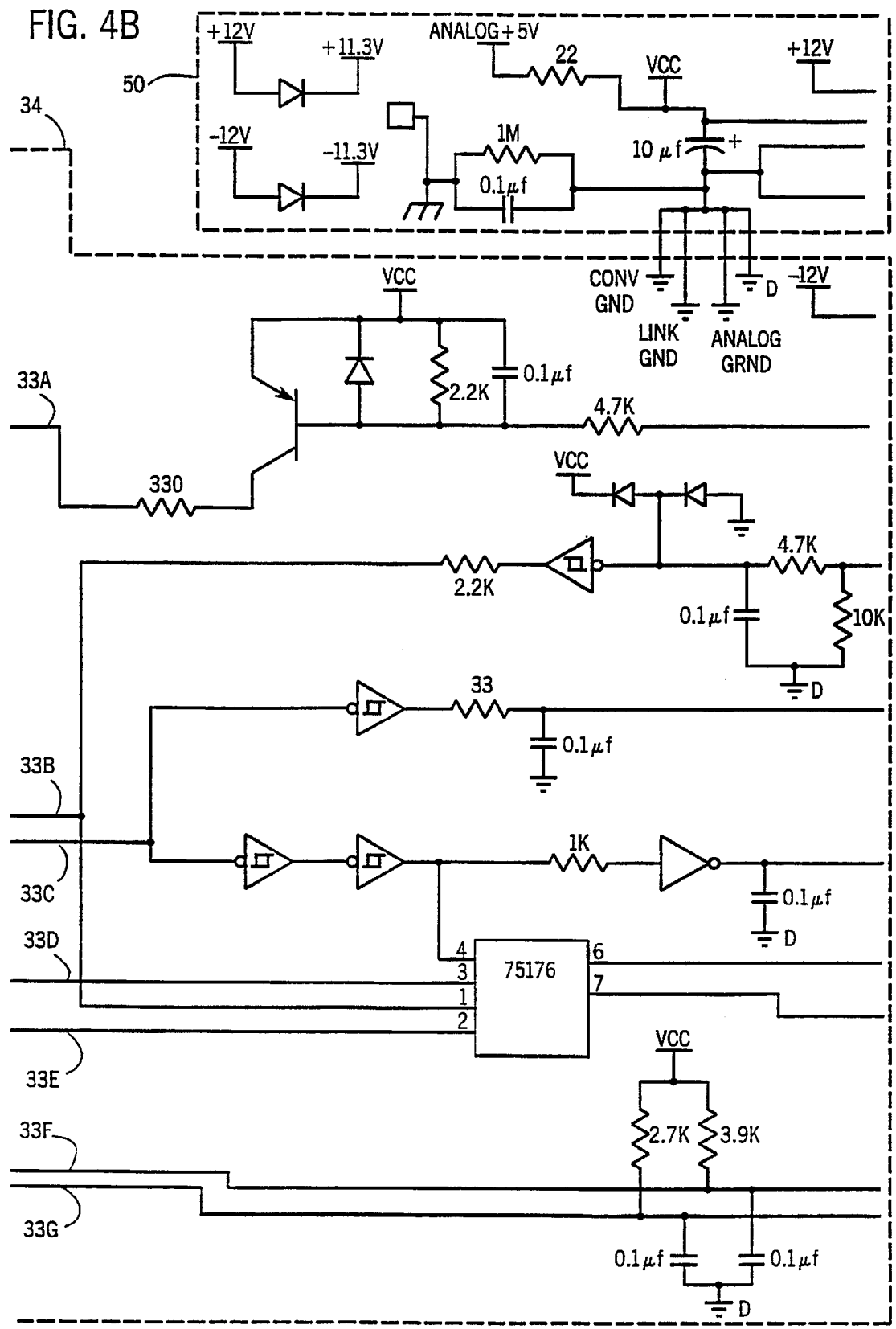
Figure 4C:
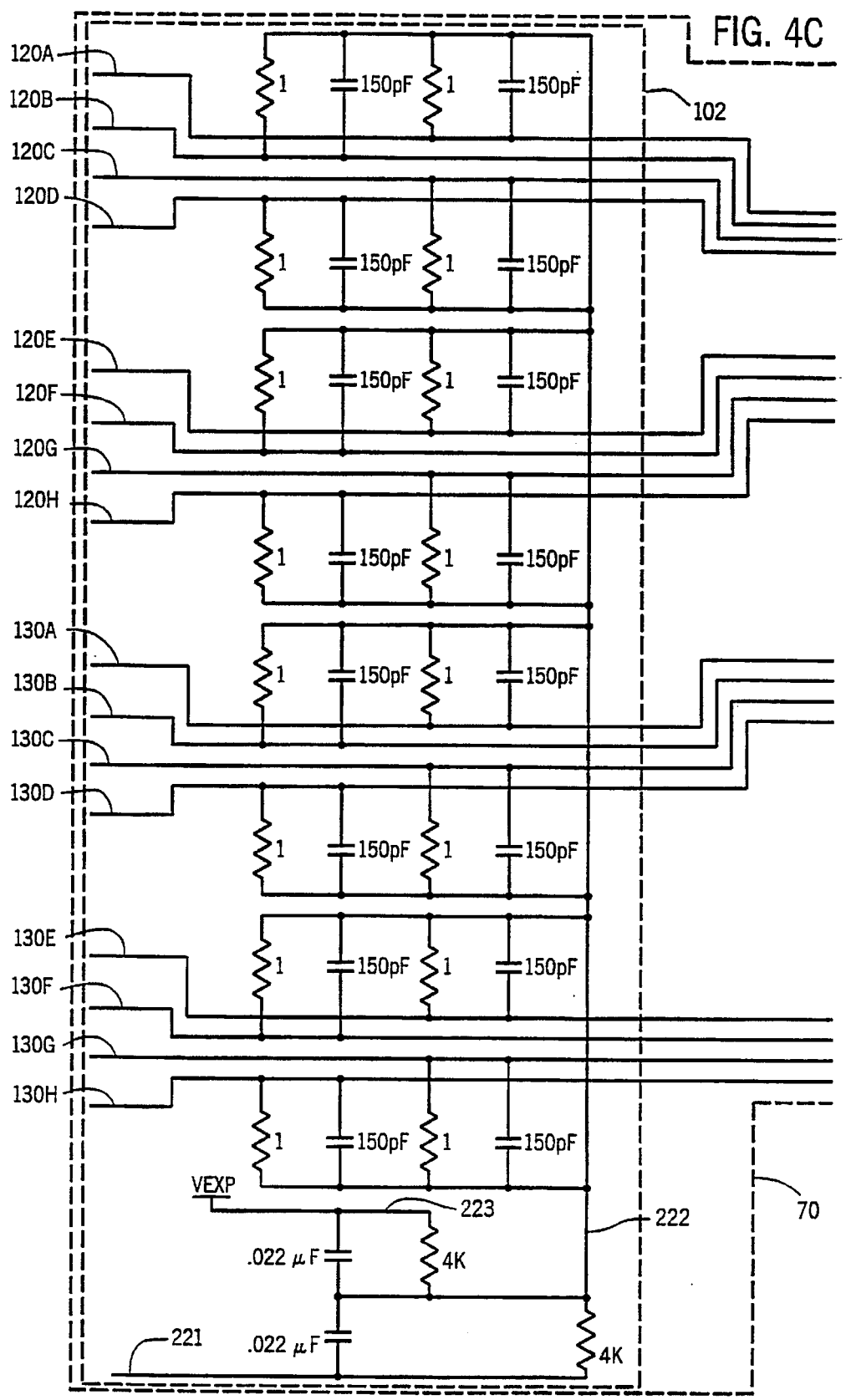
Figure 4D:
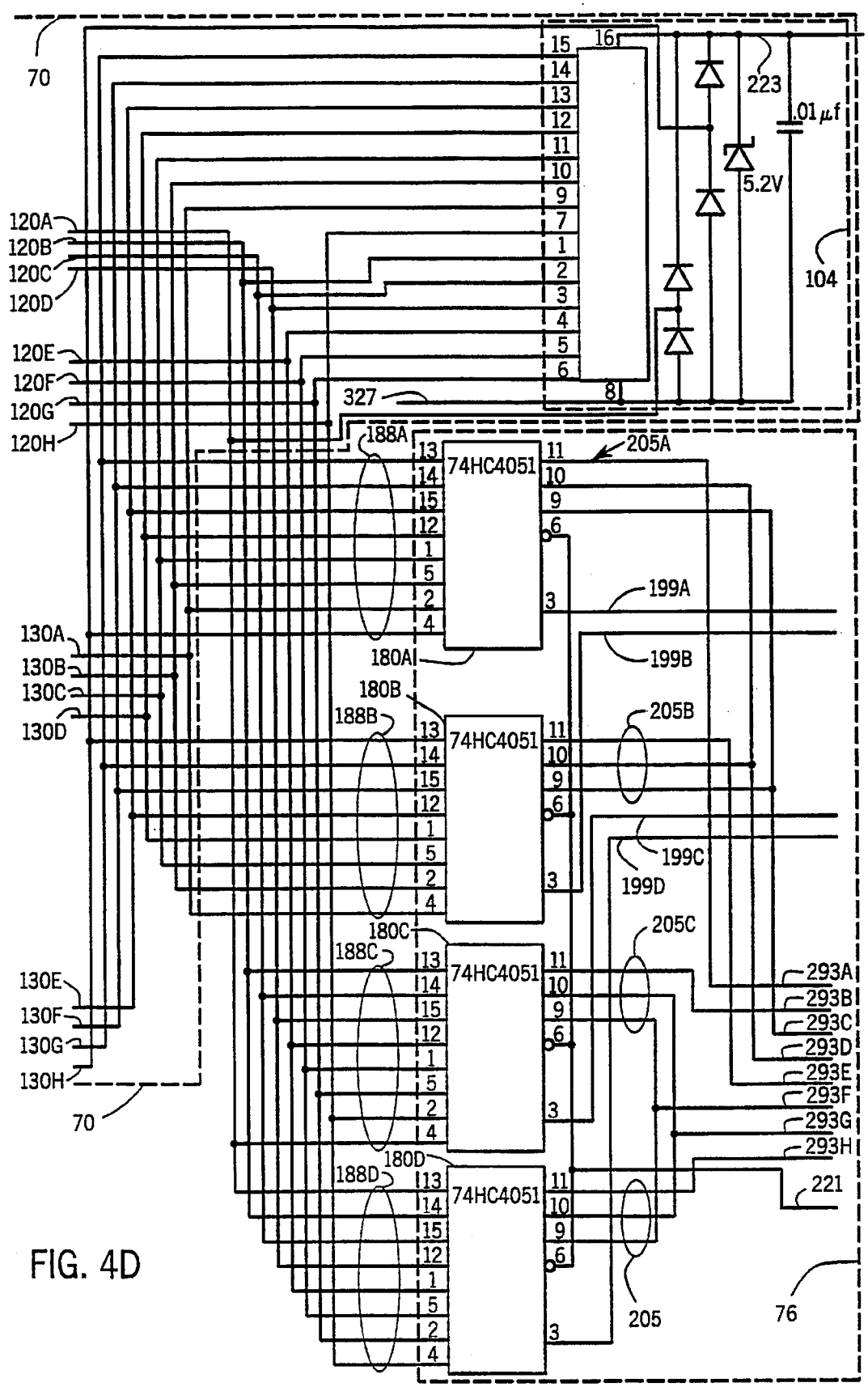
Figure 4E:
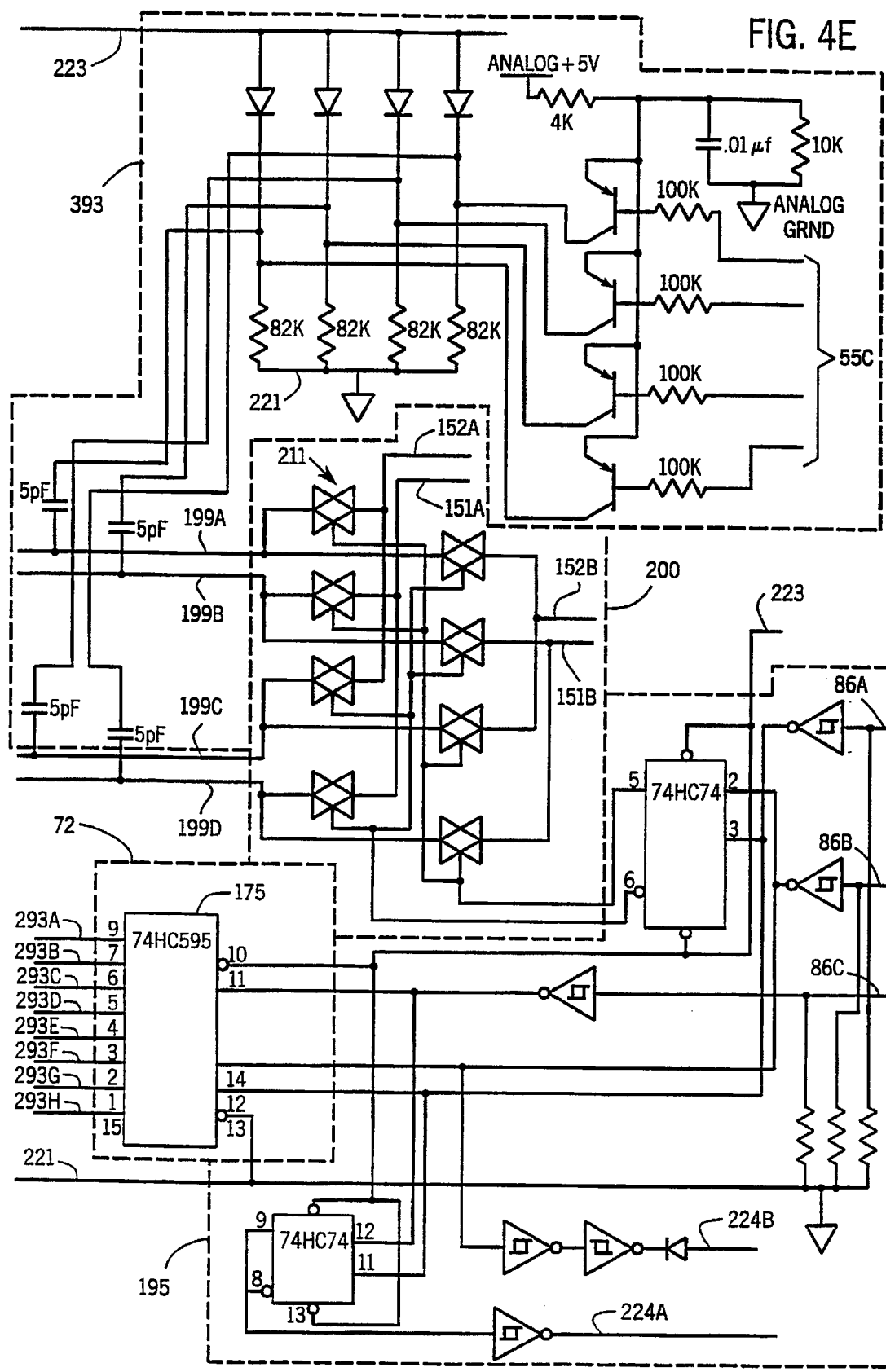

FIGS. 4A–I show a detailed electrical schematic diagram of another preferred embodiment of control circuit 25 for use in sensor 15. The various circuits and operations discussed with reference to FIGS. 1–3 are similar to those shown in FIGS. A–I. Control circuit 25 in FIGS. 4A–I additionally includes a boost power supply 210 (FIG. 4H), an analog power circuit 391 (FIG. 4A), a power supply 50 (FIG. 4B), and a test circuit 393 (FIG. 4E). FIGS. 4A–I include preferred exemplary component values, part numbers, and interconnections. The specific component values, part numbers and interconnections shown and described below are given in an exemplary fashion and do not limit the scope of the invention as recited in the claims. The operation and structure of control circuit 25 are discussed below with reference to FIGS. 4–5.

Figure 4F:
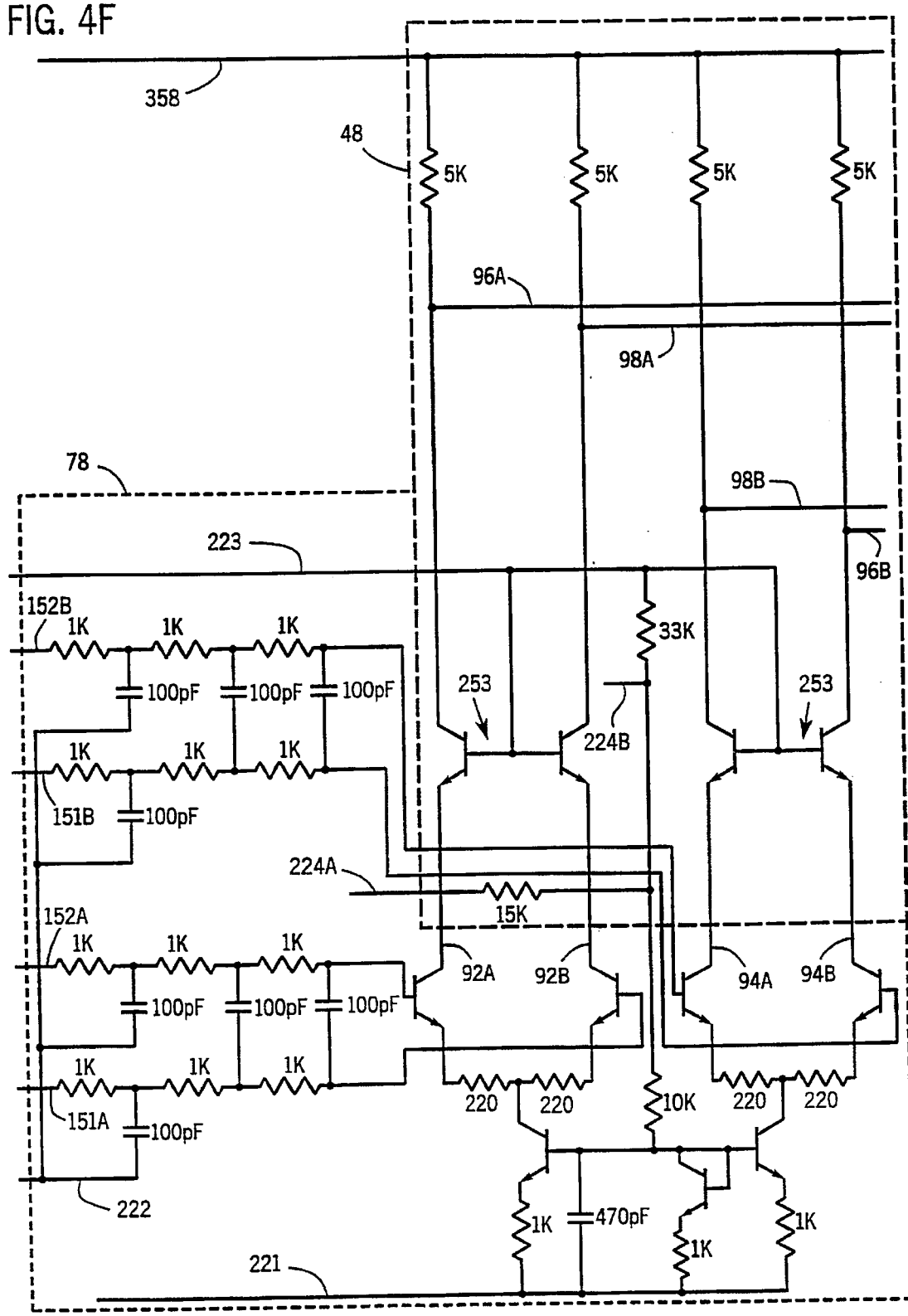
Figure 4G:
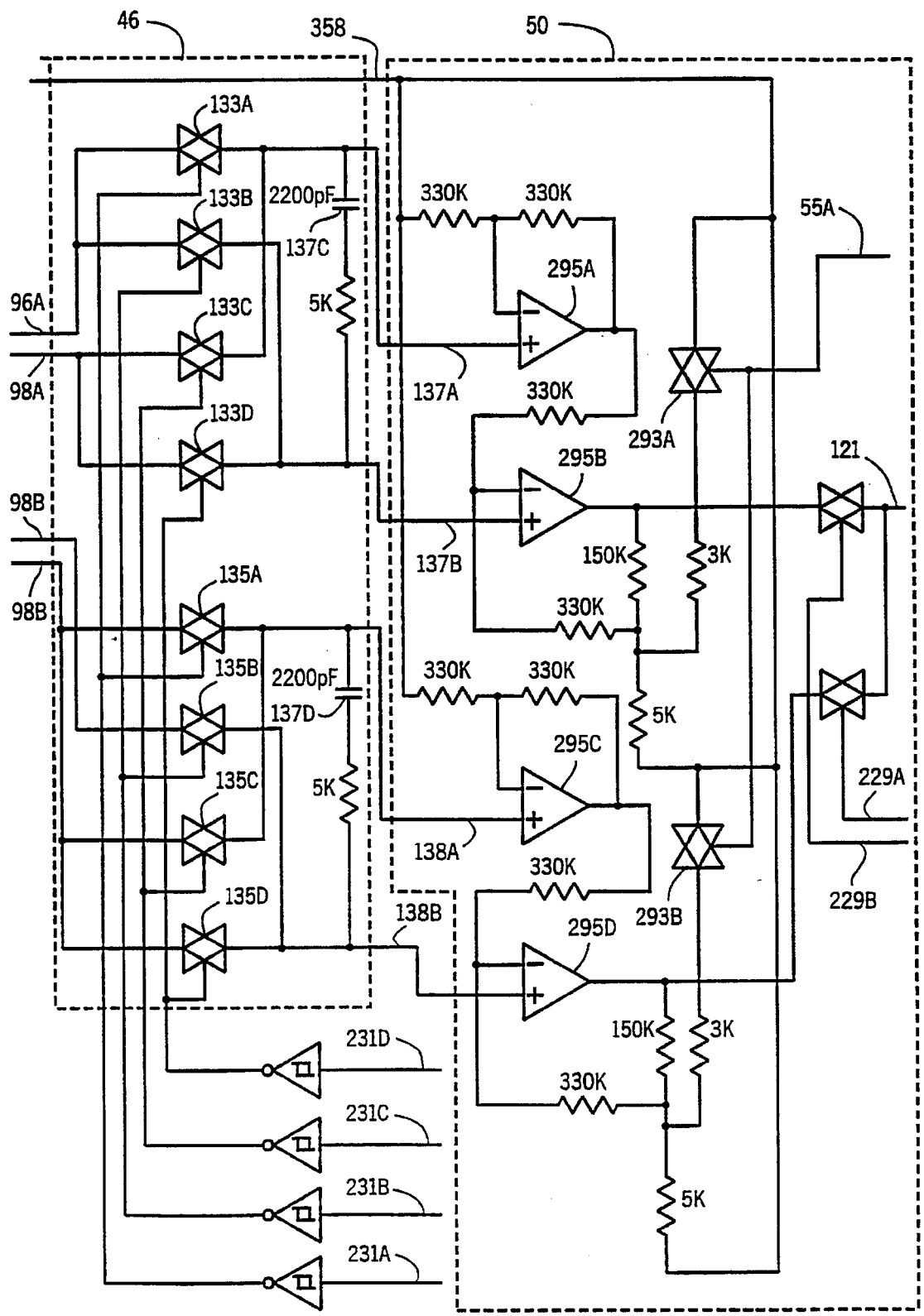
Figure 4H:
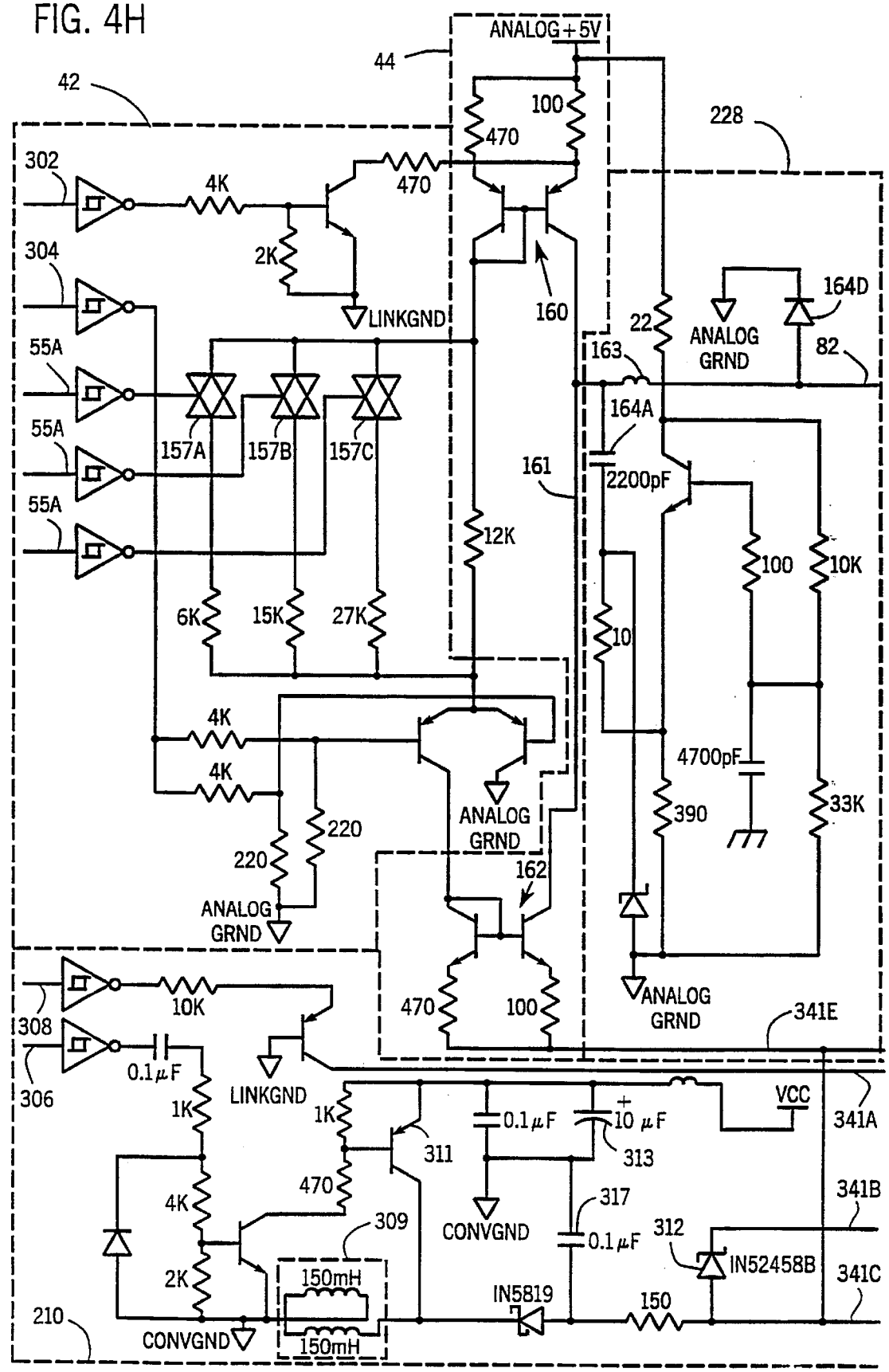
Figure 4I:
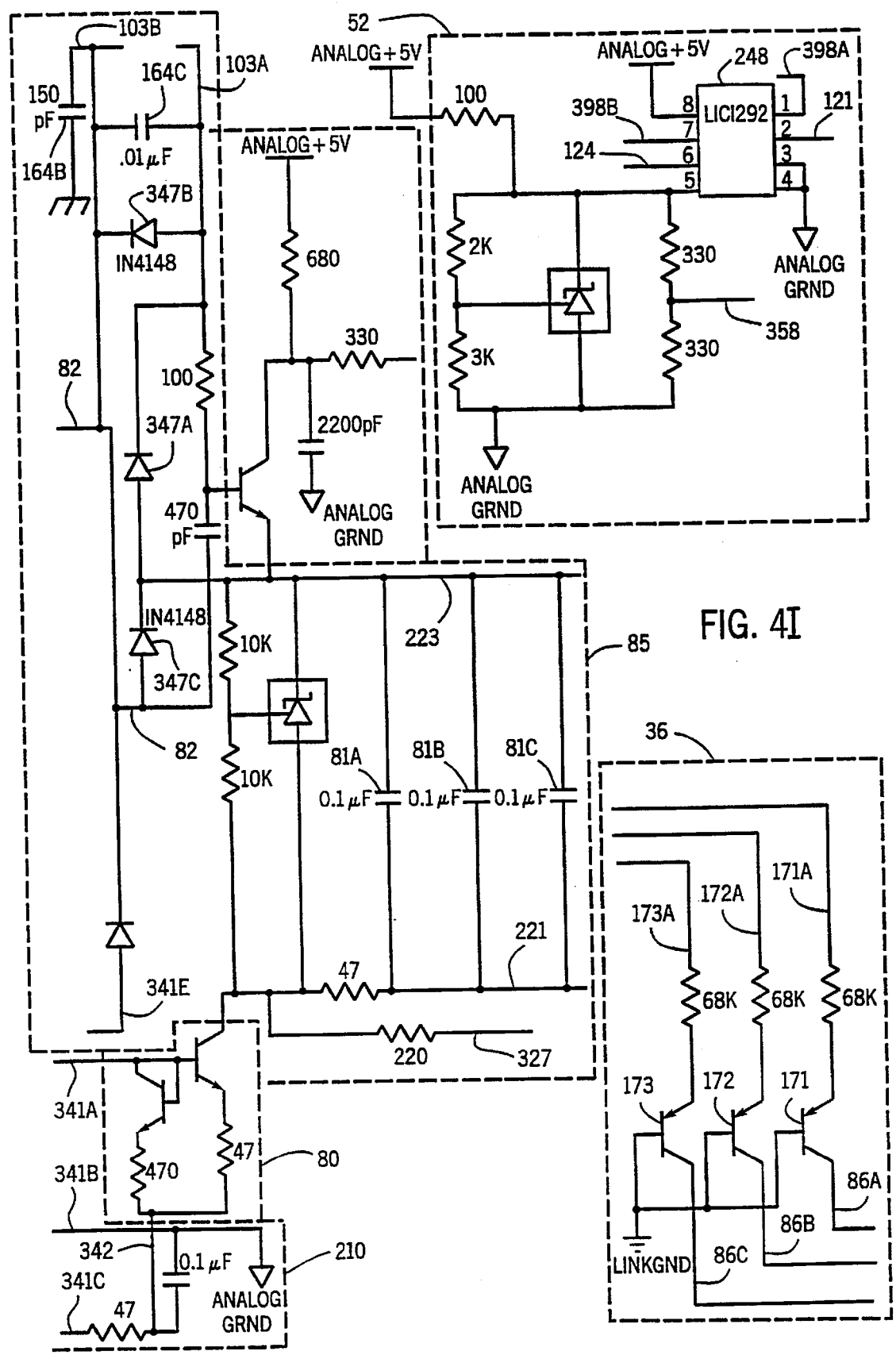
Figure 5:
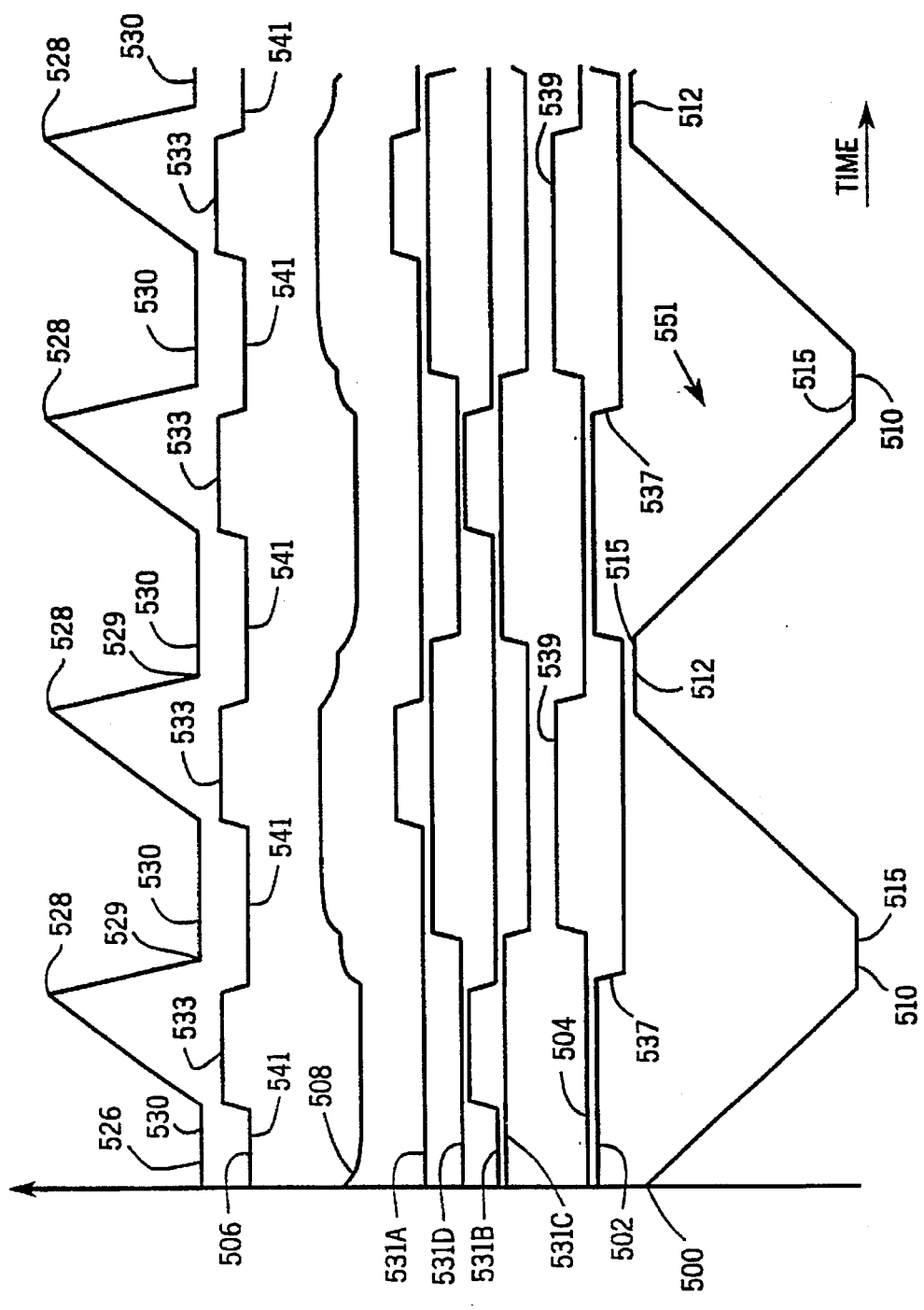
FIG. 5 is a timing diagram illustrating the generation of the excitation and sensor signals produced by the capacitive touch sensor illustrated in FIG. 1.

FIG. 5 shows an excitation signal 500 which is produced as a 20 V peak-to-peak trapezoidal signal by control circuit 25 shown in FIGS. 4A–I. Excitation signal 500 changes from a negative peak 510 to a positive peak 512 in approximately 10 microseconds; excitation signal 500 is provided with a repetition rate of approximately 30–50 KHz. Excitation signal 500 preferably includes 16 trapezoidal waveforms such as a trapezoidal waveform 551. The generation of excitation signal 500 as well as the control signals associated with excitation signal 500 are discussed below with reference to FIGS. 4A–I and 5.

With reference to FIGS. 4A–I, processor 34 (FIGS. 4A–B) includes an 80C52 microprocessor 35 and a nonvolatile storage circuit 37 for storing configuration data for sensor 15. Microprocessor 35 receives a 16 MHz clock pulse from oscillator 32. Processor 34 is also coupled to register 54 which provides configuration signals to other components within sensor 15. The configuration signals are provided on conductors 55A and 55C. The signals on conductors 55C are received by waveform generator 42 (FIG. 4H) and are used to test sensor 15, and the signals on conductor 55A program the slew rate of excitation signal 500 (FIG. 5).

Microprocessor 35 also provides a number of excitation control signals for generating excitation signal 500. Microprocessor 35 provides synchronous control signals 531A, 531B, 531C and 531D (FIG. 5) on conductors 231A, 231B, 231C, and 231D (FIGS. 4A and 4G), respectively. Synchronous control signals 531A–D are utilized to control analog switches 133A–D and 135A–D, respectively, in synchronous rectifier 46 (FIG. 4G). Microprocessor 35 also produces a charge signal 502 at a conductor 302 and a discharge signal 504 at a conductor 304 for controlling the charging and discharging of excitation signal 500 (FIGS. 4A and 4H). Microprocessor 35 provides a boost signal 506 at a conductor 306 and a preamplifier power signal 508 at a conductor 308 for controlling power supply 210 (FIGS. 4A and 4H). Power supply 210 is a rapid startup, low noise boost converter for powering excitation driver 44 when driver 44 provides the 20 V peak-to-peak excitation signal 500. Supply 210 is low noise by virtue of being synchronous with the excitation.

Waveform generator 42 cooperates with driver 44, power supply 210, and shunt regulator 85 to provide excitation signal 500 across conductors 223 and 221. Generator 42 (FIG. 4H) includes analog switches 157A–C. Analog switches 157A–C have control inputs coupled to conductors 55A. Microprocessor 35 through register 54 programs switches 157A–C with the signals on conductors 55A to adjust the slew rate of excitation signal 500. Current mirrors 160 and 162 of driver 44 provide positive and negative current to conductor 82. The level of the current is set by the state of switches 157A–C. Waveform generator 42 charges and discharges a capacitor 164A via conductor 161. When a logic high (e.g., state 537 of charge signal 502) is provided on conductor 302, current mirror 160 provides current to capacitor 164A so that excitation signal 500 changes from positive peak 512 to negative peak 510 (e.g., to charge to a negative peak voltage). Capacitors 164B and 164C perform electro magnetic interference (EMI) suppression functions.

Similarly, microprocessor 35 provides logic high (state 539 of discharge signal 504) on conductor 304 to discharge current from capacitor 164A. When logic high charge signal 502 is provided on conductor 304, current mirror 162 draws current and excitation signal 500 changes from negative peak 510 to positive peak 512 (e.g., discharges to a positive peak voltage). When discharge signal 504 and charge signal 502 are both a logic low, a dwell period 515 (e.g., no change in voltage level of signal 500) is provided on excitation signal 500. Neither current mirror 160 or 162 draws current when signals 502 and 504 are a logic low. Therefore, microprocessor 35 shapes excitation signal 500 via control signals on conductors 55A and conductors 302 and 304. Capacitors 81A–C are logic bypass capacitors for interface 28.

Driver 44 is coupled to supply 210 via a conductor 341E. Supply 210 is an inductive boost converter which provides the power to driver 44 for the generation of 20 V peak-to-peak excitation signal 500. Microprocessor 35 provides to supply 210 a power enable signal on conductor 308 which powers supply 210 through current source 80. Supply 210 generates 20 VDC across a diode 312 by driving current through an inductor circuit 309. When boost control signal 506 is a logic low (e.g., a state 541), current travels through an inductor circuit 309, thereby creating a magnetic field in inductor circuit 309. As boost control signal 506 changes to a logic high (e.g., a state 533), transistor 311 is turned OFF and the energy stored in inductor circuit 309 discharges into a capacitor 317. A boost signal 526 (FIG. 5) represents the current traveling through inductor circuit 311. Preferably, microprocessor 35 synchronizes charge signal 502, discharge signal 504, and boost control signal 506 so that noise from supply 210 does not detrimentally affect excitation signal 500. Buffer circuit 228 advantageously provides a buffered reference to the chassis ground.

In this preferred embodiment, excitation signal 500 is simultaneously provided to each of conducting lines 120A–H and 130A–G as well as guard conductors 103A–B. The excitation signal is provided to a conductor 222 in ESD protection and termination circuit 70. ESD protection and termination circuit 70 is comprised of an ESD circuit 104 and a termination circuit 102. Circuit 104 (FIG. 4D) provides a diode clamp circuit for preventing large voltages on conducting lines 120A–H and 130A–G. Circuit 102 (FIG. 4C) provides a termination circuit including termination resistors for interface 28 for reception by conducting lines 120A–H and 130A–G (FIG. 4C).

Multiplexer control circuit 72 (FIG. 4E) includes a shift register 175 and a logic circuit 195 coupled to conductors 86A–C. Microprocessor 35 provides the multiplexer control signals on conductors 171A–C (FIG. 4A). The multiplexer control signals are shifted by level shifting transistors 172A–C (FIG. 4I) and provided on conductors 86A–C, respectively. Transistors 172A–C shift the multiplexer control signals from the logic level associated with microprocessor 35 to the logic level associated with floating interface 28. The multiplexer control signals are provided through logic circuit 195 to shift register 175. Shift register 175 advantageously selects particular ones of conducting lines 120A–H and 130A–G through multiplexer circuit 76 in response to the multiplexer control signals. Logic circuit 195 also advantageously selects gains for preamplifier 78 (FIG. 4F) by providing gain signals on conductors 224A and 224B in response to the multiplexer control signals.

Multiplexer circuit 76 (FIG. 4D) includes multiplexers 180A–D. Multiplexer 186A has inputs 188A coupled through protection circuit 70 to conducting lines 120A–G. Multiplexer 180B has inputs 188B coupled to conducting lines 130A–G, respectively. Similarly, multiplexer 180C has inputs 188C coupled to conducting lines 120A–G, and multiplexer 180D has inputs 188D coupled to conducting lines 130A–G. Multiplexers 180A–D provide the selected conducting line on outputs 199A–D, respectively. A selected signal on conducting lines 199A–D is provided in response to the multiplexer control signals provided from shift register 175 to control inputs 205A–D on multiplexers 180A–D, respectively. The selected conducting lines are provided to a selection circuit 200 which utilizes an array of analog switches 211 to select sensor signals from outputs 199A–D. Selection circuit 200 provides a first pair of sensor signals on conductors 151A and 152A and a second pair on conductors 151B and 152B. Switches 211 are controlled by selection signals from logic circuit 195. Also, a test circuit 320 is provided which is coupled to conductors 55C. Test circuit 320 is utilized for testing array 20 and providing simulated touch signals to outputs 199A–D.

The sensor signals on conductors 151A–B and 152A–B are provided to preamplifier 78 (FIG. 4F). Preamplifier 78 is configured as a differential amplifier and amplifies the sensor signals on conductors 151A–D and 152A–B. Preamplifier 78 provides the amplified sensor signals to conductors 92A–B and 94A–B. Level shifter 48 (FIG. 4F) is comprised of transistors 253 which shift the reference level of the signals on conductors 92A–B and 94A–B to ground reference levels associated with microprocessor 35. Level shift circuit 48 provides the signals received on conductors 92A–B and 94A–B to conductors 96A–B and conductors 98A–B, respectively.

Synchronous rectifier 46 (FIG. 4G) accumulates a charge associated with the sensor signals on conductors 96A and 98A in a capacitor 137C. Synchronous rectifier 46 accumulates a charge associated with the sensor signals on conductors 96B and 98B in a capacitor 137D. Switches 133A–D and 135A–D are controlled by rectifier control signals 531A–D (FIG. 5) provided on conductors 231A–D by microprocessor 35 (FIG. 4A). The rectifier control signals 531A–D are provided in synchronization with excitation signal 500 so that the sensor signals are appropriately accumulated on capacitors 138A–B. Microprocessor 35 provides rectifier control signals on conductors 231A–D so that the sample signals stored in capacitors 130A–B are representative of the difference in capacitive loading between horizontal sensor bars 105 coupled to the selected conducting lines of lines 120A–H and 130A–G. Switches 133A–B cooperate to provide sample signals on conductors 137A–B and 138A–D on DC amplifier 50.

DC amplifier 50 (FIG. 4G) is preferably comprised of operational amplifiers 295A–D. Amplifiers 295A–D provide an amplified sample signal at amplifier output 121. The sampled signal received at conductor 121 is selected by select signals provided on conductors 299A and B. The select signal is provided by microprocessor 35 so that only one sample signal of the sample signals on conductors 137A–B and 138A–B is provided on conductor 121. Processor 34 can adjust the gain of amplifiers 295A–B via switches 293A–B. Processor 34 shorts capacitors 137C and 137D via switches 133A–D and 135A–D to prevent previous charge accumulations on capacitors 137C–D from affecting the current sample. A/D converter 52 receives the sample signal on conductor 121. A/D converter 52 (FIG. 4I) includes a serial A/D converter 248 which receives the sampled signal at conductor 121 and provides a digital word (e.g., data representative of the sample signal) at conductor 124. Microprocessor 35 receives the data at conductor 124 and analyzes the data in accordance with the resident software program.

It is understood, while the detailed drawings and specific examples given described a preferred exemplary embodiment of the present invention, therefore the purpose of illustration only. The apparatus and method of the invention is not limited to the precise details and conditions disclosed. For example, although a sensor may having sensor bars arranged in 8 and 7 horizontal groups, almost any number of groups could be used to form a sensor array. For example, larger screens may utilize triangular projections into neighboring bars. Various other bar profiles may be modified to allow mechanical interpolation. Further, single lines in the various drawings can represent multiple conductors. Still further, sensor bars arranged vertically or at any angle other than horizontal could be used, by programming processor 34 with appropriate trigonometric functions to convert location values derived from sensor bars arranged at an angle to location values having horizontal and vertical coordinates. Even further still, implementations intended for large scale integration may incorporate 15 signal processing channels for simultaneous acquisition of all signal pairs. Various changes can be made to the details disclosed without departing from the spirit of the invention which is defined by the following claims.

I claim:

1. A capacitive touch sensor for sensing a touch, comprising:
    a plurality of sensor bars configured in an arrangement wherein each bar is substantially parallel to a first axis and substantially perpendicular to a second axis; and
    a control circuit coupled to said plurality of sensor bars to provide an excitation signal to the plurality of sensor bars, receive a capacitive sense signal, and generate a position signal indicative of a position of the touch on the arrangement, the position signal indicating the position along the first axis and the position along the second axis, wherein the control circuit is coupled to a first side of the sensor bars via a set of N lines and to a second side of the sensor bars via a set of M lines, wherein N and M are not equal.

2. The capacitive touch screen of claim 1 wherein the first axis is a horizontal axis and the second axis is a vertical axis.

3. The capacitive touch screen of claim 2, further comprising a floating interface coupled between the sensor bars and the control circuit.

4. The capacitive touch screen of claim 3 wherein the control circuit provides the excitation signal on the set of N lines and receives the capacitive sense signal on the set of M lines.

5. A method of locating the position of a touch on a touch sensor including an array of bars disposed parallel to a first axis and a control circuit providing excitation signals to a first side of the array, receiving sense signals at a second side of the array, providing excitation signals to the second side of the array and receiving sense signals at the first side of the array, the method comprising steps of:
    determining a closest bar of the array of bars in response to the sense signals, the closest bar being a bar nearest the touch, thereby determining a first position of the touch along a second axis perpendicular to the first axis by determining a bar location of the closest bar in the array of bars; and
    determining a second position of the touch along the first axis by analyzing at least one of the sense signals received on the first side of the array and at least one of the sense signal received on the second side of the array.

6. The method of claim 5 wherein the second position is determined by analyzing a first closest sense signal received on the first side of the array associated with the closest bar and a second closest sense signal received on the second side of the array associated with the closest bar.

7. The method of claim 6 wherein the second position is calculated by dividing the first closest sense signal by a sum of the first closest sense signal and the second closest sense signal.

8. The method of claim 5 further comprising the step of:
    determining a first bar located below the closest bar and a second bar located above the closest bar of the array of bars in response to the sense signals;
    determining the first position of the touch along a second axis perpendicular to the first axis by analyzing a first bar sense signal of the sense signals associated with the first bar and a second bar sense signal of the sense signals associated with the second bar.

9. The method of claim 5 wherein the closest bar is determined by determining a peak signal of the sense signals.

10. The method of claim 8 wherein the second position is determined by interpolating between the first bar sense signal and the second bar sense signal.

11. The method of claim 5 further comprising the step of:
    before the determining a closest bar step, analyzing the sense signals by comparing the sense signals to a running average to determine if the touch has occurred.

12. An improved capacitive touch screen for use with a display for providing images on a face, the touch screen situated proximate the face of the display, the touch screen including a control circuit for generating a position signal indicative of the vertical and horizontal location of a touch proximate the touch screen, the improvement comprising:
    a capacitive sensor array consisting of parallel bars extending in a single direction, the parallel bars having a first end and a second end, the control circuit providing an excitation signal to the first end and the control circuit receiving a sense signal at the second end, the control circuit generating the position signal in response to the sense signal.

13. The improved capacitive touch screen of claim 12 wherein the bars are comprised of indium tin oxide.

14. The improved capacitive touch screen of claim 12 further comprising conductors coupled between the control circuit and the bars, the bars being necked in a location where the conductors are coupled.

15. A touch sensor for use with a touch screen having a sensor array, the touch sensor comprising:
    a power supply;
    an excitation driver, coupled to the power supply, for providing an excitation signal;
    a control circuit, coupled to the power supply, the control circuit determining a location of a touch in response to a sense signal; and
    a floating interface circuit coupled to the power supply, the sensor array, the excitation driver, and the control circuit, the floating interface circuit receiving a power signal referenced to the excitation signal;
    wherein the excitation driver provides the excitation signal to the sensor array through the floating interface circuit and the control circuit receives the sense signal from the sensor array through the floating interface circuit.

16. The touch sensor of claim 15 wherein the power supply includes a first power conductor and a first return conductor, and the excitation driver includes an output for providing the excitation signal, and wherein the floating interface circuit includes a second power conductor, a second return conductor, and a current source, wherein the current source is coupled between the first power conductor and the second power conductor, the excitation driver being coupled to the first return conductor, and the second return conductor being coupled to the output of the excitation driver, thereby referencing the floating interface circuit to the excitation signal.

17. The touch sensor of 15 wherein the floating interface circuit includes a preamplifier for amplifying the sense signal.

18. The touch sensor of claim 17 wherein the floating interface circuit includes analog switches coupled to receive the excitation signal.

19. The touch sensor of claim 17 further comprising a level shifter coupled between the sense circuit and the floating interface circuit.

20. An improved capacitive touch panel system including a capacitive sensor array including sensor bars and a control circuit, the control circuit providing an excitation signal to the sensor bars and receiving a capacitive sense signal from the sensor bars, the control circuit generating a control signal indicative of a position of a touch in response to the capacitive sense signal, and a floating interface circuit referenced to the excitation signal, the interface circuit coupled between the control circuit and the capacitive sensor array, wherein the control circuit is referenced to ground, the capacitive sense signal being a difference signal associated with at least two of the sensor bars.

21. A capacitive touch sensor for sensing a position of a touch, the capacitive touch sensor comprising:

an array of non-intersecting bars disposed along a first axis; and a control circuit coupled to the array of the non-intersecting bars to provide excitation signals to at least one pair of the non-intersecting bars at a first side of the non-intersecting bars and receive a differential signal from the at least one pair at a second side of the non-intersecting bars, the control circuit providing a control signal indicative of the position of the touch on the array in response to the differential signal, the control signal indicating the position along the first axis.

22. The capacitive touch sensor of claim 21, wherein the control signal also indicates the position along a second axis perpendicular to the first axis.

* * * * *

UNITED STATES PATENT AND TRADEMARK OFFICE
CERTIFICATE OF CORRECTION

PATENT NO. : 5,650,597
DATED : July 22, 1997
INVENTOR(S) : Redmayne, D.

It is certified that error appears in the above-identified patent and that said Letters Patent is hereby corrected as shown below:

In the abstract, delete the last sentence and replace it with --The touch sensor may be utilized to build touch screens having thick dielectric faces, and can also eliminate the need for a rear guard layer.--

In the drawings, Sheet 8, FIG. 4E, 74HC74 at the bottom shows output pins 8 and 9 connected together. The line extending from output pin 8 should be deleted. Thus, only output pin 9 should be coupled to line 224A.

In the drawings, Sheet 10, FIG. 4G, 98B appears twice at the left-hand side of Sheet 10, one closer to the top of the page ("Upper 98B") and one closer to the bottom of the page ("Lower 98B"). Delete Lower "98B" and replace it with --96B--. Lower 98B should be coupled only to analog switches 135C and 135D. Upper 98B should be coupled only to analog switches 135A and 135B.

UNITED STATES PATENT AND TRADEMARK OFFICE
CERTIFICATE OF CORRECTION

PATENT NO. : 5,650,597
DATED : July 22, 1997
INVENTOR(S) : Redmayne, D.

It is certified that error appears in the above-identified patent and that said Letters Patent is hereby corrected as shown below:

In the drawings, Sheet 12, FIG. 4I, delete the label on device 248 "LICI292" and replace it with --LTC1292--.

Signed and Sealed this

Thirty-first Day of March, 1998

Attest:

BRUCE LEHMAN

Attesting Officer

Commissioner of Patents and Trademarks